(12) United States Patent  
Gan

(10) Patent No.: US 9,637,834 B2  
(45) Date of Patent: May 2, 2017

(54) ELECTRICALLY PROGRAMMABLE FUSE STRUCTURE AND FABRICATION METHOD THEREOF

(71) Applicant: Semiconductor Manufacturing International (Shanghai) Corporation, Shanghai (CN)

(72) Inventor: Zhenghao Gan, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/965,674

(22) Filed: Dec. 10, 2015

(65) Prior Publication Data

US 2016/0196946 A1 Jul. 7, 2016

(30) Foreign Application Priority Data

Jan. 6, 2015 (CN) .......................... 2015 1 0006081

(51) Int. Cl.
*H01L 23/525* (2006.01)
*C25D 5/00* (2006.01)
*H01H 85/046* (2006.01)
*H01H 85/10* (2006.01)
*H01H 85/02* (2006.01)

(52) U.S. Cl.
CPC ............. *C25D 5/00* (2013.01); *H01H 85/046* (2013.01); *H01L 23/5256* (2013.01); *H01H 85/10* (2013.01); *H01H 2085/0283* (2013.01)

(58) Field of Classification Search
None
See application file for complete search history.

(56) References Cited

U.S. PATENT DOCUMENTS

| 7,732,893 | B2* | 6/2010 | Iyer | H01L 23/5256 257/209 |
|---|---|---|---|---|
| 2005/0212080 | A1* | 9/2005 | Wu | H01L 23/5256 257/529 |
| 2005/0277232 | A1* | 12/2005 | Wu | H01L 23/5256 438/132 |
| 2006/0087001 | A1* | 4/2006 | Kothandaraman | H01L 23/5256 257/529 |
| 2007/0210412 | A1* | 9/2007 | Booth, Jr. | H01L 23/5256 257/529 |
| 2007/0252237 | A1* | 11/2007 | Ko | H01L 23/5256 257/529 |
| 2008/0052659 | A1* | 2/2008 | Booth, Jr. | H01L 23/5256 257/529 |
| 2008/0093703 | A1* | 4/2008 | Yang | H01L 23/5256 257/529 |

(Continued)

*Primary Examiner* — Hoang-Quan Ho
(74) *Attorney, Agent, or Firm* — Anova Law Group, PLLC

(57) ABSTRACT

A method for fabricating an electrically programmable fuse structure is provided. The method includes providing a substrate. The method also includes forming an anode and a cathode on the substrate. Further, the method includes forming a fuse between the anode and the cathode and having an anode-connecting-end connecting with the anode and a cathode-connecting-end connecting with the cathode over the substrate. Further, the method also includes forming a compressive stress region in the cathode-connecting-end, wherein the anode-connecting-end has a tensile stress region.

17 Claims, 4 Drawing Sheets

(56) References Cited

U.S. PATENT DOCUMENTS

| | | | |
|---|---|---|---|
| 2008/0217733 A1* | 9/2008 | Iyer | H01L 23/5256 257/529 |
| 2008/0217736 A1* | 9/2008 | Cestero | H01L 23/5252 257/530 |
| 2008/0258255 A1* | 10/2008 | Ker | H01L 23/5256 257/529 |
| 2009/0001506 A1* | 1/2009 | Kim | H01L 23/5256 257/529 |
| 2009/0302417 A1* | 12/2009 | Kim | H01L 23/5256 257/529 |
| 2010/0038747 A1* | 2/2010 | Chanda | H01L 23/5256 257/529 |
| 2010/0148915 A1* | 6/2010 | Kuo | H01L 23/5256 337/290 |
| 2010/0224956 A1* | 9/2010 | Kim | H01L 23/5256 257/529 |
| 2010/0230673 A1* | 9/2010 | Ravit | H01L 23/5256 257/49 |
| 2010/0301417 A1* | 12/2010 | Cheng | H01L 27/0629 257/355 |
| 2011/0156858 A1* | 6/2011 | Poppe | G11C 17/16 337/414 |
| 2014/0091427 A1* | 4/2014 | Jeon | H01L 23/5226 257/529 |
| 2015/0028447 A1* | 1/2015 | Zhang | H01L 27/0617 257/529 |
| 2016/0071582 A1* | 3/2016 | Chung | G11C 11/1675 365/96 |
| 2016/0071797 A1* | 3/2016 | Gan | H01L 23/5256 257/529 |

* cited by examiner

ELECTRICALLY PROGRAMMABLE FUSE STRUCTURE AND FABRICATION METHOD THEREOF

CROSS-REFERENCES TO RELATED APPLICATIONS

This application claims the priority of Chinese patent application No. 201510006081.0, filed on Jan. 6, 2015, the entirety of which is incorporated herein by reference.

FIELD OF THE INVENTION

The present invention generally relates to the field of semiconductor manufacturing and, more particularly, relates to electrically programmable fuse structures and fabrication processes thereof.

BACKGROUND

In the field of integrated circuits (ICs), a fuse is referred to a fusible interconnect wire formed in an IC. Primarily, a fuse is used to connect redundant circuits in an IC. When a defect is found in the IC by a testing process, the fuse is used to repair, or substitute the circuit having the defect. Fuses usually include laser fuses and electrically programmable fuses (Efuses). With the continuous development of the semiconductor technology, Efuses have gradually substituted the laser fuses.

Usually, an Efuse structure is made of metal or silicon. A typical Efuse structure includes an anode, a cathode, and a fuse connecting both the anode and the cathode between the anode and the cathode. When the fuse does not blow out, the Efuse structure is at a low-resistance state. When a relatively large current is passing through the fuse from the anode to the cathode, the electro-migration is often accompanied by a mass transportation. Thus, some local regions of the fuse can have a mass accumulation or whiskers; and other local regions of the fuse can have voids. The voids can cause the fuse to blow out. When the fuse blows out, the Efuse structure is at a high-resistance state. The Efuse structure has the characteristic of being transferred from a low-resistance state to a high-resistance state by an electrically current. Such a characteristic is referred as a programmable effect. Thus, the Efuse structure is a programmable fuse. Besides being widely used in the redundant circuits, the Efuse structures also have more applications, such as one time program (OTP) circuits, etc.

However, the programming power consumption of the existing Efuse structure is relatively large; and the programming time is relatively long. The disclosed device structures and methods are directed to solve one or more problems set forth above and other problems.

BRIEF SUMMARY OF THE DISCLOSURE

One aspect of the present disclosure includes providing a method for fabricating an electrically programmable fuse structure. The method includes providing a substrate. The method also includes forming an anode and a cathode on the substrate. Further, the method includes forming a fuse between the anode and the cathode and having an anode-connecting-end connecting with the anode and a cathode-connecting-end connecting with the cathode over the substrate. Further, the method also includes forming a compressive stress region in the cathode-connecting-end, wherein the anode-connecting-end has a tensile stress region.

Another aspect of the present disclosure includes providing an electrically programmable fuse structure. The electrically programmable fuse structure includes a substrate having a surface. The electrically programmable fuse structure also includes an anode formed on the surface of the substrate. Further, the electrically programmable fuse structure includes a cathode formed on the surface of substrate. Further, the electrically programmable fuse structure also includes a fuse formed on the surface of the substrate and having an anode-connecting-end having a tensile stress and connecting with the anode, and a cathode-connecting-end having a compressive stress and connecting with the cathode.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
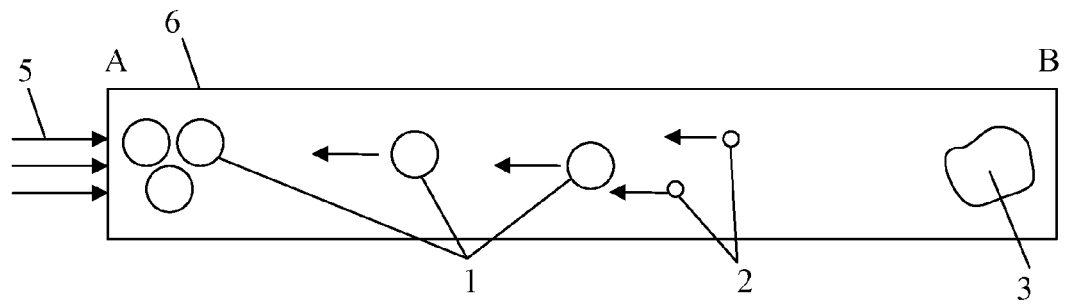
FIG. 1 illustrates an existing electrically programmable fuse in operation.

FIG. 1 illustrates an existing programmable fuse that is in operation. As shown in FIG. 1, during the blowing out of a fuse 6, electrons 2 may migrate from a cathode A to an anode B. The electrons 2 may also push the atoms 1 to migrate along the same direction. Thus, vacancies (not labeled) may be formed in the cathode B; and the vacancies may accumulate at the cathode B to form a void 3. When the vacancies accumulate to a certain degree, that is, the size of the void 3 increases to a certain value, the fuse 6 may blow out.

However, during the migration of the electrons 2, a counter force 5, which may prevent the migration of the electrons 2, may be generated in the anode A. The counter force 5 may be a mechanical force. The electromigration may be described by the following equation.

$$J_a = \frac{DC_a}{k_B T}\left(Z^* \cdot e \cdot \rho \cdot j - \Omega \frac{\partial \sigma}{\partial x}\right)$$

$J_a$ refers to a current density. D refers to the effective diffusion constant of the conductive material. $C_a$ refers to the concentration of the electrons. $k_B$ refers to the Boltzmann constant. Ω refers to the volume of the atom.

$$\frac{\partial \sigma}{\partial x}$$

refers to a pressure gradient.

$$\Omega \frac{\partial \sigma}{\partial x}$$

refers to the counter force. Other parameters may all be constants. Thus, according to such an equation, the counter force 5 is proportional to the concentration of the electrons 2.

The counter force 5 may hinder the electro-migration, or even counteract the electro-migration. Thus, it may affect the blowing out of the fuse 6. For example, the power consumption for the fuse 6 to blow out may be increased. Accordingly, an improved fuse structure is provided.

Figure 9:
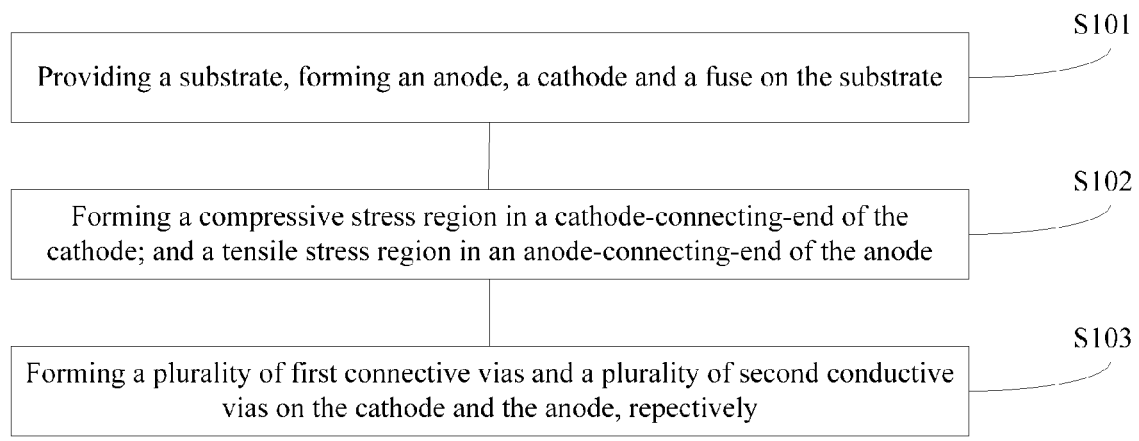
FIG. 9 illustrates an exemplary fabrication process of an electrically programmable fuse consistent with the disclosed embodiments.

FIG. 9 illustrates an exemplary fabrication process of an electrically programmable fuse structure consistent with the disclosed embodiments. FIGS. 2-6 illustrates structures corresponding to certain stages of the exemplary fabrication process.

Figure 2:
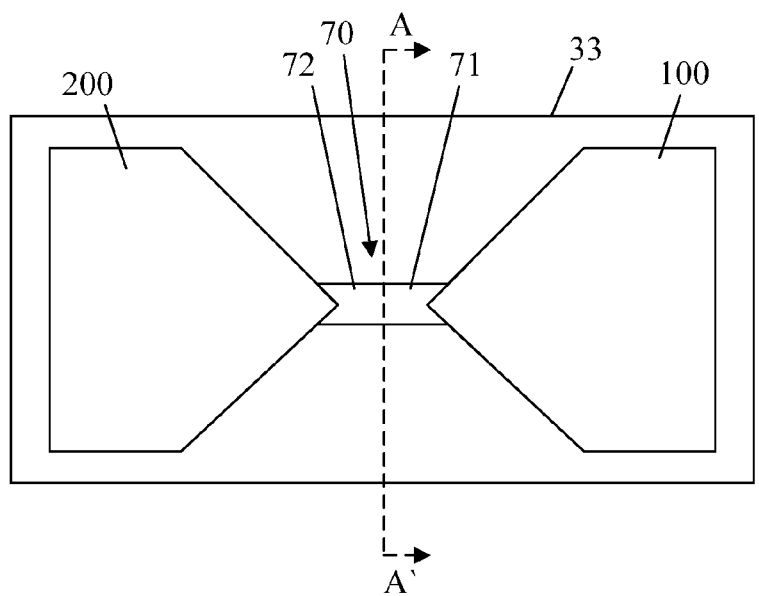
FIGS. 2-6 illustrate structures corresponding to certain stages of an exemplary fabrication process of an electrically programmable fuse structure consistent with the disclosed embodiments.
Figure 3:
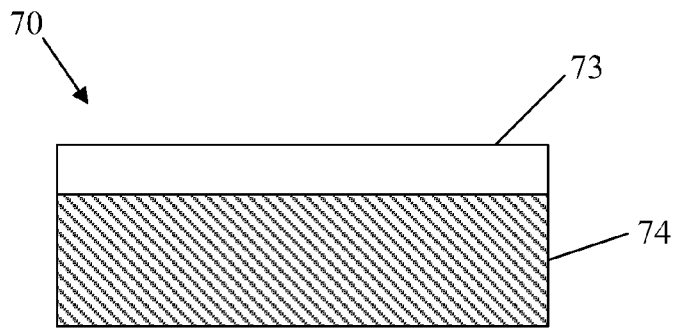

As shown in FIG. 9, at the beginning of the fabrication process, a substrate with certain structure is provided; and an anode and a cathode may be formed (S101). FIGS. 2-3 illustrate a corresponding structure. FIG. 3 is a cross-sectional view of the structure illustrated in FIG. 2 along the A-A' direction.

As shown in FIG. 2, a substrate 33 is provided. The substrate 33 may be a material layer of an IC structure, or other appropriate structures. The material layer of the IC structure may be an insulation material layer. In certain other embodiments, an insulation layer may be formed on the substrate 33 to insulate the substrate 33 and the subsequently formed anode, cathode, and fuse.

Further, an anode 200 and a cathode 100 may be formed on a surface of the substrate 33. Further, a fuse 70 may also be formed on the substrate 33 between the anode 200 and cathode 100. The fuse 70 may also be referred as an Efuse link.

One end of the fuse 70 may connect with the anode 200 and the other end of the fuse 70 may connect with the cathode 100. The portion of the fuse 70 connecting with the anode 200 may be referred as an anode-connecting-end 72, and the portion of the fuse 70 connecting with the cathode 100 may be referred as a cathode-connecting-end 71.

In one embodiment, the anode 200, the cathode 100, and the fuse 70 may be formed from a same material layer simultaneously. In certain other embodiments, the anode 200, the cathode 100, and the fuse 70 may be formed by separated steps, and may be formed from different layers.

Referring to FIG. 2, the anode 200 and the cathode 300 may all be tapered. That is, the size of a portion of the anode 200 and the size of a portion of the cathode 100 are gradually reduced along a direction close to the fuse 70. Such a geometry may facilitate the blowing out of the fuse 70.

In certain other embodiments, the anode 200 and the cathode 100 may have other appropriate shapes. For example, the anode 200 and the cathode 100 may be rectangular.

Referring to FIG. 3, in one embodiment, a process for forming the anode 200, the cathode 100 and the fuse 70 may include forming a first material layer 74 on the substrate 33; and forming a second material layer 73 on the first layer 74. The first material layer 74 may be made of any appropriate material. In one embodiment, the first material layer 74 is a polysilicon layer. The second material layer 73 may be made of any appropriate material. In one embodiment, the second layer 73 is a metal silicide layer. That is, the anode 200, the cathode 100 and the fuse 70 may be double-layer structures. When the fuse 70 blows out, both the metal silicide layer 73 and the polysilicon layer 74 may blow out.

Conductive vias may be subsequently formed to electrically connect with the anode 200 and the cathode 100. The conductive vias may electrically connect with the polysilicon layer 74 through the metal silicide layer 73. The metal silicide layer 73 may reduce the contact resistance between the subsequently formed conducive vias and the polysilicon layer 74. Further, in one embodiment, the metal silicide layer 73 may be used to subsequently forming a compressive stress layer and a tensile stress layer.

In certain other embodiments, the metal silicide layer 73 may be omitted. That is, the fuse 70 may be a single-layer structure made of polysilicon. A compressive stress layer and a tensile stress layer may be subsequently formed in the polysilicon layer; and the subsequently formed conductive vias may directly connect with polysilicon layer.

In one embodiment, the polysilicon layer 74 and the metal silicide layer 73 may be formed using a shadow mask. The shadow mask may define the shape of the electrically programmable fuse structure.

In certain other embodiments, after forming the first material layer 74 and the second material layer 73, an etching process may be performed to define the shape of the electrically programmable fuse structure. The first material layer 74 and the second material layer 73 may be formed by any appropriate process, such as a chemical vapor deposition (CVD) process, a physical vapor deposition (PVD) process, an atomic layer deposition (ALD) process, or a flowable CVD (FCVD) process, etc.

Figure 4:
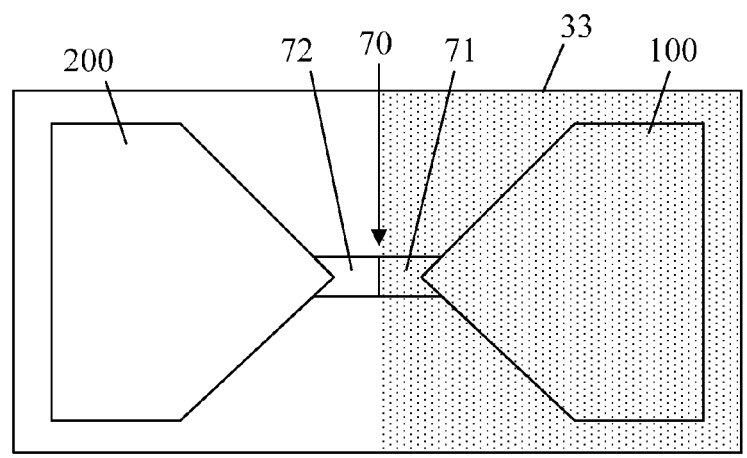
Figure 5:
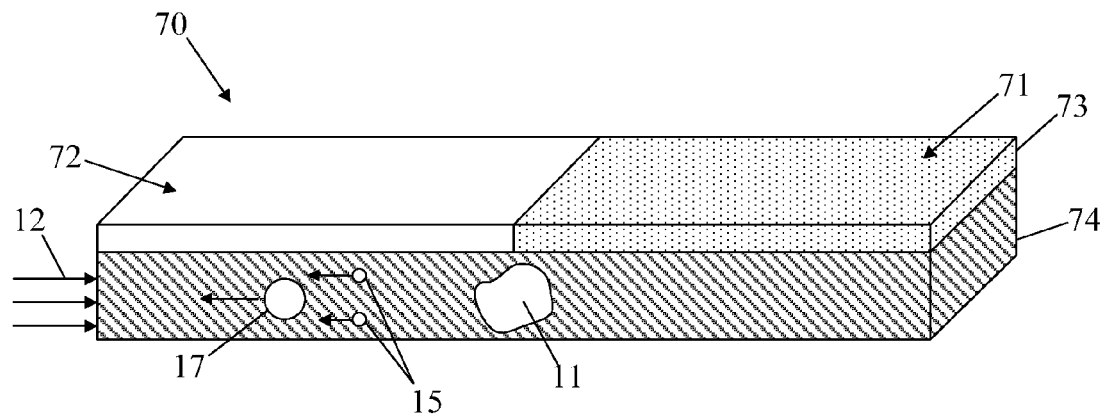

Returning to FIG. 9, after forming the anode 200, the cathode 100, and the fuse 70, a compressive stress region may be formed (S102). FIGS. 4-5 illustrate a corresponding structure. FIG. 5 is a three dimensional view of the structure illustrated in FIG. 4.

As shown FIG. 4, a tensile stress region (doted region, not labeled) is formed in the cathode-connecting-end 71 of the fuse 70. The tensile stress region may cover one-half of the substrate 33 having the cathode 100.

In one embodiment, as shown in FIG. 5, the tensile stress region are formed in the metal silicide layer 73. The metal silicide layer 73 may contact with the polysilicon layer 74. Thus, the tensile stress may transfer to the corresponding region in the polysilicon layer 74.

Further, the anode-connecting-end 72 may have a tensile stress. In one embodiment, the tensile stress in the anode-connecting-end 72 may be from the fabrication process of the fuse, i.e., an intrinsic tensile stress. In certain other embodiments, a tensile stress region may be formed in the anode-connecting-end 72 to cause the anode-connecting-end to have a tensile stress.

The compressive stress and the tensile stress may aid the blowing out of the fuse 70. Referring to FIG. 5, during the blowing out of the fuse 70, electrons 15 may migrate from the cathode 100 to the anode 200. During such electro-migration, the atoms 17 of the material of the fuse 70 may be pushed to the anode 200. Thus, vacancies (not labeled)

may be formed. When the vacancies are accumulated to a certain degree, voids 11 may be formed. When the size of the voids 11 increase to a certain scale, the fuse 70 may blow out. During the electro-migration process, the atoms 17 of the material of the fuse 70 may gradually accumulate at the anode 200, a counter force, i.e., the mechanical force 12 may resist the electro-migration process. The tensile stress in the anode-connecting-end 71 may counteract a portion of the mechanical force 12. Thus, it may make the electro-migration easier than without a tensile stress. Accordingly, the fuse 70 may be relatively easy to blow out under a same power consumption. That is, the power consumption for the fuse 70 to blow out may be reduced.

Further, the compressive stress in the cathode-connecting-end 71 of the fuse 70 may also aid the blowing out of the fuse 70. The compressive stress in the cathode-connecting-end 71 may make the migration of the atoms 17 of the cathode-connecting-end to be harder than without the compressive stress. However, in the portion of the cathode-connecting-end 71 close to the anode-connecting-end 72, the compressive stress may be counteracted partially by the tensile stress in the anode-connecting-end 72. Thus, the compressive stress in the portion of the cathode-connecting-end 71 close to the anode-connecting-end 72 may be reduced. Therefore, it may be easier for the portion of the fuse 70 in the cathode 100 closer to the anode 200 to have an electro-migration. That is, the electro-migration may occur at the interface region between the cathode-connecting-end 71 and the anode-connecting-end 72, i.e., the middle of the fuse 70. The possibility for generating voids 11 at the interface region may be increased; and it may be easier for the fuse 70 to blow out at the interface region between the cathode-connecting-end 71 and the anode-connecting-end 72.

Further, referring to FIG. 5, the atoms 17 may migrate from the portion of the cathode-connecting-end 71 in the middle of the fuse 70, comparing with the existing techniques in which the atoms may need to migrate from an anode to a cathode, the migration path of the atoms 17 may be reduced. That is, the time for the fuse 70 to blow out may be significantly reduced. Thus, it may aid the blowing out of the fuse 70; and the programming time of the electrically programmable fuse structure may be reduced.

The compressive stress region may be formed in the cathode-connecting-end 71 by any appropriate process. In one embodiment, the compressive region may be formed by performing an ion implantation process on the cathode-connecting-end 71 of the fuse 70. Various ions may be used for the ion implantation process, such as tin ions, lead ions, arsenic ions, phosphorous ions, antimony ions, bismuth ions, sulfur ions, selenium ions, tellurium ions, polonium ions, bromide ions, or iodine ions, etc.

The tensile stress region may be formed in the anode-connecting-end 72 by any appropriate process. In one embodiment, the tensile stress region may be formed by performing an ion implantation process on the anode-connecting-region 71 of the fuse 70. Various ions may be used for the ion implantation process, such as phosphorous ions, arsenic ions, or boron ions, etc.

In certain other embodiments, the tensile stress in the anode-connecting-end 72 may be the intrinsic stress. Thus, the anode-connecting-end 72 may be unnecessarily doped to have the tensile stress. That is, the anode-connecting-end 72 might not be doped or may be lightly-doped.

Figure 7:
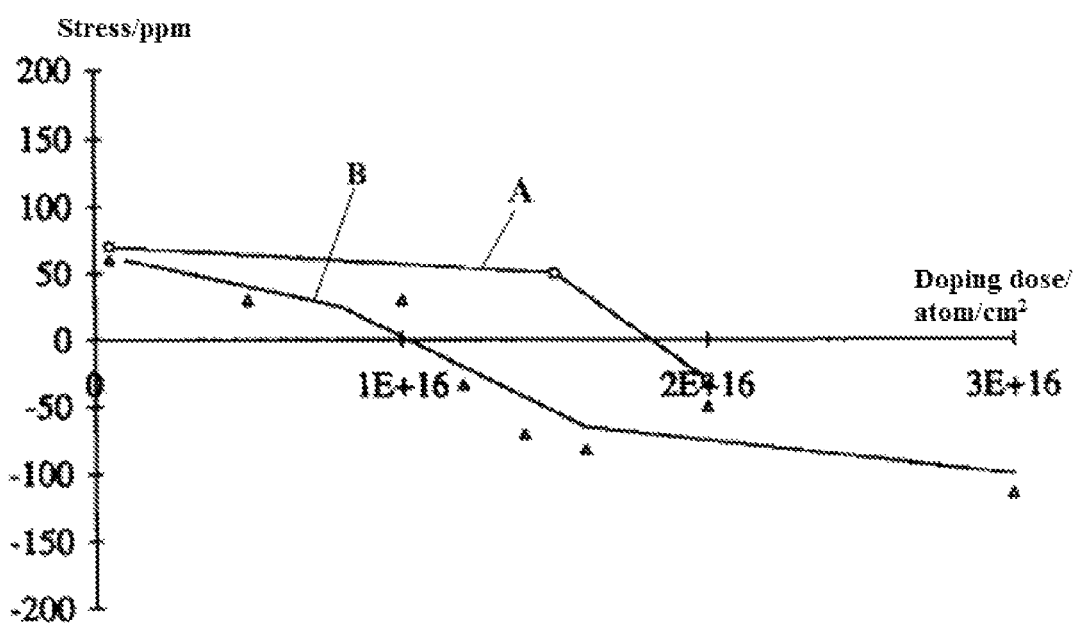
FIG. 7 illustrates a relationship between a doping dose and a stress in a polysilicon layer consistent with the disclosed embodiments.

FIG. 7 illustrates a relationship between the doping dose and the stress in a polysilicon layer. The polyline A refers to a relationship between the doping dose of phosphorous ions and the stress in the polysilicon layer. The polyline B refers to a relationship between the doping dose of arsenic ions and the stress in the polysilicon layer. The ordinate of the graph refers to the stress in the polysilicon layer. When the stress is a positive value, the stress may refer to a tensile stress. When the stress is a negative value, the stress may refer to a compressive stress. The abscissa of the graph refers to the doping dose.

As shown in the polyline A of FIG. 7, when the doping dose of phosphorous ions are greater than approximately $1.8E16$ atom/cm$^2$, the stress in the polysilicon layer may be changed from a tensile stress to a compressive stress. As shown in the polyline B of FIG. 7, when the doping dose of phosphorous ions are greater than approximately $1E16$ atom/cm$^2$, the stress in the polysilicon layer may be changed from a tensile stress to a compressive stress.

Such relationships may also be applicable to the metal silicide layer 73. The doping dose may be an illustrative value, in a practical application, the threshold of the doping dose for changing a tensile stress to a compressive stress may also be dependent of other parameters.

Further, as shown in FIG. 7, in one embodiment, the doping concentration, i.e., corresponding to the doping dose, of the compressive stress region may be greater than the doping concentration of the tensile stress region. Specifically, the tensile stress region on the anode-connecting-end 72 may be undoped, or the doping concentration of the tensile stress region in the anode-connecting-end 71 may be substantially lower than the doping concentration the cathode-connection-end 71. The tensile stress region may be referred as a lightly doped region. Comparing with the tensile stress region, the compressive stress region may be referred as a heavily doped region. In one embodiment, the doping concentration difference between the compressive stress region and the tensile stress region may be in a range of approximately $1E15$ atom/cm$^2$~$1E17$ atom/cm$^2$.

In one embodiment, the tensile stress region and the compressive stress region may be formed, sequentially, by forming a first mask layer exposing the cathode-connecting-end 71 of the fuse 70 on the anode 200, the cathode 100 and the fuse 70; performing the ion implantation process on the cathode-connecting-end 71 using the first mask layer as a mask to form the compressive stress region; removing the first mask layer; forming a second mask layer exposing the anode-connecting-end 72 on the anode 200, the cathode 100 and the fuse 70; and performing the ion implantation process on the anode-connecting-end 72 to form the tensile stress region. Thus, the tensile stress region and the compressive stress region may be formed.

The first mask layer and the second mask layer may be photoresist layers, or hard mask layers, etc. The first mask layer and the second mask layer may be formed by any appropriate process, such as a spin-coating process, or a chemical vapor deposition process, etc.

In certain other embodiments, the tensile stress region may be formed firstly. After forming the tensile stress region, the compressive stress region may be formed.

In certain other embodiments, a metal silicide layer 73 having a tensile stress may be formed directly. One portion of the metal silicide layer 73 having the tensile stress may be used as the anode-connecting-end 72 having the tensile stress; and the other portion may be doped to have a compressive stress; and used as the cathode-connecting-end 71 having the compressive stress.

Figure 6:
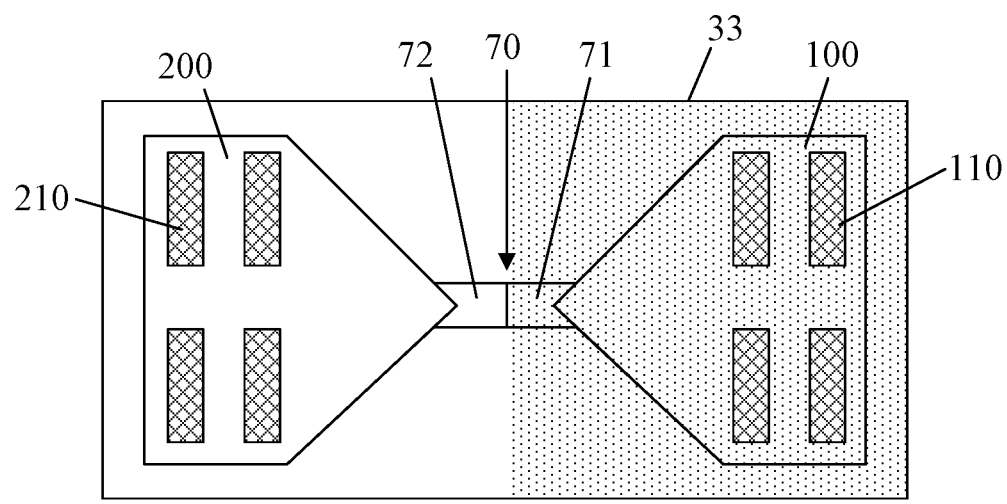

Returning to FIG. 9, after forming the compressive stress region and the tensile stress region, conductive vias may be formed (S103). FIG. 6 also illustrates a corresponding structure.

As shown in FIG. 6, a plurality of first conductive vias 110 and a plurality of second conductive vias 210 are formed on the cathode 100 and the anode 200, respectively. The first conductive vias 110 and the second conductive vias 210 may be made of any appropriate material, such as Cu, Al, or W, etc.

A process for forming the plurality of first conductive vias 110 and the plurality of second conductive vias 210 may include forming a photoresist layer having a plurality of first openings exposing the cathode 100 and a plurality of second openings exposing the anode 200 over the substrate 33; and followed by forming the first conductive vias 110 in the first openings and the second conductive vias 210 in the second openings, respectively. Thus, the first conductive vias 110 may be formed on the cathode 100; and the second conductive vias 210 may be formed on the anode 200. After forming the first conductive vias 110 and the second conductive vias 210, the photoresist layer may be removed.

The conductive vias 110 and the second conductive vias 210 may be formed by any appropriate process, such as a physical vapor deposition process, a sputtering process, or an electroplating process, etc. The photoresist layer may be removed by any appropriate process, such as a dry etching process, a wet etching process, or a plasma ashing process, etc.

Figure 8:
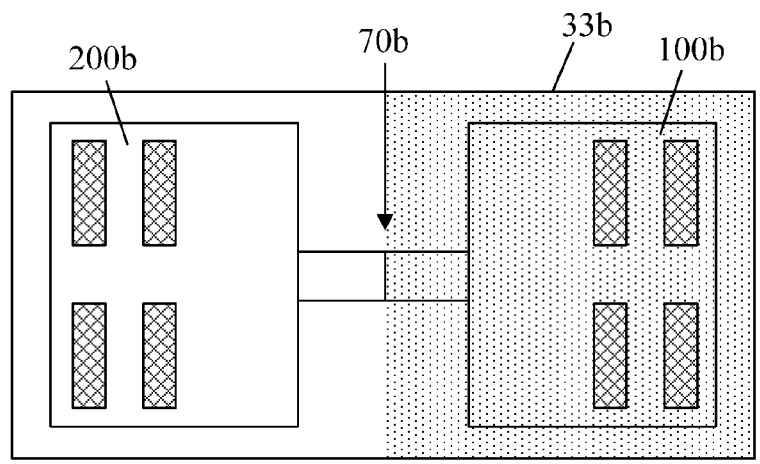
FIG. 8 illustrates another exemplary electrically programmable fuse structure consistent with the disclosed embodiments.

Thus, an electrically programmable fuse structure may be formed by the above-disclosed processes and methods; and a corresponding electrically programmable fuse structure is illustrated in FIG. 6. As shown in FIG. 6, the electrically programmable fuse structure may include a substrate 33. The electrically programmable fuse structure may also include a tapered anode 200 and a tapered cathode 100. Further, the electrically programmable fuse structure may include a fuse 70 having an anode-connecting-end 72 connecting with the anode 200 and a cathode-connecting-end 71 connecting with the cathode 100. Further, the electrically programmable fuse structure may also include a tensile stress region in the anode-connecting-end 72 and a compressive stress region in the cathode-connecting-end 71. The electrically programmable fuse structure may also include a plurality of first conductive vias 110 formed on the cathode 100 and a plurality of second conductive vias 210 formed on the anode 200. The detailed structures and intermediate structures are described above with respect to the fabrication processes FIG. 8 illustrates another exemplary electrically programmable fuse structure formed by the above-disclosed processes and methods. As shown in FIG. 8, the electrically programmable fuse structure may include a substrate 33b. The electrically programmable fuse structure may also include a rectangular anode 200b and a rectangular cathode 100b. Further, the electrically programmable fuse structure may include a fuse 70b having an anode-connecting-end (not labeled) connecting with the anode 200b and a cathode-connecting-end (not labeled) connecting with the cathode 100b.

Further, the electrically programmable fuse structure may also include a tensile stress region (not shown) in the anode-connecting-end and a compressive stress region (not labeled) in the cathode-connecting-end. The electrically programmable fuse structure may also include a plurality of first conductive vias (not labeled) formed on the cathode 100b and a plurality of second conductive vias (not labeled) formed on the anode 200b. The detailed structures and intermediate structures are described above with respect to the fabrication processes.

Thus, according to the disclosed embodiments, the cathode-connecting-end of the fuse in the electrically programmable fuse structure may be doped to have a compressive stress; and the anode connecting end of the fuse in the fuse structure may have a tensile stress. The tensile stress in the anode may counteract a portion of the counter force, i.e., a mechanical stress. Thus, it may make the electro-migration to be relatively easy; and the power consumption for the fuse to blow out may be reduced.

Further, the compressive stress in the cathode-connecting-end may cause the electro-migration to be relatively difficult. The stress at the interface region between the portion of the anode having the tensile stress and the portion of the cathode having the compressive stress may be reduced. Thus, the scale of the electro-migration at the interface region may be increased; and the possibility for forming voids at the interface region may be increased.

That is, the compressive stress in the cathode-connecting-end of the fuse in the electrically programmable fuse structure may cause the voids to be formed at the interface region between the portion of the anode having the tensile stress and the portion of the cathode having the compressive stress; and the fuse may blow out at the interface region. Therefore, the migration path of atoms in the fuse may be reduced; the time for the electrically programmable fuse structure to blow out may be significantly reduced. That is, the programming time of the electrically programmable fuse structure may be reduced.

Therefore, the compressive stress in the cathode region and the tensile stress in the anode region may aid the blowing out of the fuse. The power consumption for the electrically programmable fuse structure to blow out may be reduced. The time for the fuse to blow out may be significantly reduced; and the programming time of the electrically programmable fuse structure may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an electrically programmable fuse structure, comprising:
   providing a substrate;
   forming an anode and a cathode on the substrate;
   forming a fuse between the anode and the cathode and having an anode-connecting-end connecting with the anode and a cathode-connecting-end connecting with the cathode over the substrate,
   wherein the fuse includes a first material layer on the substrate, and a second material layer on the first material layer; and
   forming a compressive stress region in the second material layer of the cathode-connecting-end, wherein the second material layer of the anode-connecting-end has a tensile stress region, a doping concentration of the compressive stress region is greater than a doping concentration of the tensile stress region and a doping concentration difference between the compressive stress region and the tensile stress region is in a range of approximately 1E15 atom/cm$^2$~1E17 atom/cm$^2$.

2. The method according to claim 1, wherein:
the anode-connecting-end is doped with one of phosphorous ions, arsenic ions and boron ions to form the tensile stress region in the anode-connecting-end.

3. The method according to claim 1, wherein:
the first material layer on the substrate is a polysilicon layer; and
the second material layer on the first material layer is a metal silicide layer.

4. The method according to claim 3, wherein:
the tensile stress region is formed in the metal silicide layer in the anode-connecting-end; and
the compressive stress region is formed in the metal silicide layer in the cathode-connecting-end.

5. The method according to claim 1, wherein the compressive stress region is formed in the cathode-connecting-end by:
doping the cathode-connecting-end using doping ions including one of tin ions, lead ions, arsenic ions, phosphorous ions, antimony ions, bismuth ions, sulfur ions, selenium ions, tellurium ions, polonium ions, bromide ions, and iodine ions.

6. The method according to claim 1, wherein forming the compressive stress region in the cathode-connecting-end further comprises:
forming a first mask layer exposing the cathode-connecting-end and covering: the cathode, the anode and the anode-connecting-end of the fuse; and
doping the cathode-connecting-end using the first mask layer as a mask to form the tensile stress region in the cathode-connecting-end.

7. The method according to claim 1, further comprising:
forming a plurality of the first conductive vias and a plurality of second conductive vias on the cathode and the anode, respectively.

8. An electrically programmable fuse structure, comprising:
a substrate having a surface;
an anode formed on the surface of the substrate;
a cathode formed on the surface of substrate; and
a fuse formed on the surface of the substrate and having an anode-connecting-end connecting with the anode, and a cathode-connecting-end connecting with the cathode, wherein:
the fuse includes a first material layer on the substrate, and a second material layer on the first material layer,
the second material layer of the cathode-connecting-end includes a compressive stress region, and
the second material layer of the anode-connecting-end includes a tensile stress region, wherein the tensile stress region covers one-half of the substrate containing the cathode and the cathode-connecting end.

9. The electrically programmable fuse structure according to claim 8, wherein:
the cathode-connecting-end is doped with one of tin ions, lead ions, arsenic ions, phosphorous ions, antimony ions, bismuth ions, sulfur ions, selenium ions, tellurium ions, polonium ions, bromide ions, and iodine ions.

10. The electrically programmable fuse structure according to claim 8, wherein:
the anode-connecting-end of the fuse has an intrinsic tensile stress.

11. The electrically programmable fuse structure according to claim 8, wherein:
the anode-connecting-end of the fuse is doped to form the tensile stress region.

12. The electrically programmable fuse structure according to claim 8, wherein:
the cathode and the anode have one of a tapered shape and a rectangular shape.

13. The electrically programmable fuse structure according to claim 8, wherein:
the first material layer includes a polysilicon layer on the substrate;
the second material layer includes a metal silicide layer on the polysilicon layer;
the metal silicide layer of the cathode-connecting-end is the compressive stress region; and
the metal silicide layer of the anode-connecting-end is the tensile stress region.

14. The electrically programmable fuse structure according to claim 8, wherein:
the anode, the cathode and the fuse are formed from a same material layer.

15. The electrically programmable fuse structure according to claim 8, wherein:
the cathode-connecting-end including the compressive stress region is in contact with the anode-connecting-end including the tensile stress region.

16. The electrically programmable fuse structure according to claim 8, wherein:
the anode-connecting-end forms a first half of the fuse, and
the cathode-connecting-end forms a second half of the fuse.

17. The electrically programmable fuse structure according to claim 8, wherein:
the fuse has a substantially uniform thickness.

\* \* \* \* \*